(12) United States Patent
Bolich et al.

(10) Patent No.: US 7,269,018 B1
(45) Date of Patent: Sep. 11, 2007

(54) METHOD AND APPARATUS FOR ATTACHING MULTIPLE HEAT SINKS TO MULTIPLE NON-COPLANAR COMPONENTS

(75) Inventors: Bryan Bolich, Davis, CA (US); Gwynn M. Masada, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 316 days.

(21) Appl. No.: 10/934,926

(22) Filed: Sep. 3, 2004

(51) Int. Cl.
*H05K 7/20* (2006.01)

(52) U.S. Cl. ............... 361/719; 165/80.3; 165/185; 257/719; 361/715

(58) Field of Classification Search ........ 257/718–719; 361/707, 719, 720, 715
See application file for complete search history.

(56) References Cited

U.S. PATENT DOCUMENTS

| | | | |
|---|---|---|---|
| 5,587,882 | A | 12/1996 | Patel |
| 6,462,951 | B2 | 10/2002 | Letourneau |
| 6,549,411 | B1 | 4/2003 | Herbert |
| 6,724,628 | B2 | 4/2004 | Franz et al. |
| 6,746,270 | B2 | 6/2004 | Peterson et al. |

*Primary Examiner*—Gregory D Thompson (57) ABSTRACT

A plurality of heat sinks in one example is coupled to a support structure. The support structure has a plurality of independent spring force elements that respectively contact the plurality of heat sinks such that each heat sink of the plurality of heat sinks is moveable within the support structure relative to the other heat sinks of the plurality of heat sinks. The support structure is coupled to a substrate having a plurality of components, each of the components having an upper surface, at least two of the upper surfaces being non-coplanar. The non-coplanar upper surfaces of the components are respectively coupled to the plurality of heat sinks by respective thermal interfaces.

18 Claims, 6 Drawing Sheets

```
┌─────────────────────────────────────────────────────────────┐
│   PLACING A PLURALITY OF HEAT SINKS INTO A SUPPORT STRUCTURE,│
│ EACH OF THE HEAT SINKS BEING INDEPENDENTLY MOVEABLE WITHIN THE│
│                      SUPPORT STRUCTURE                       │
│                             501                              │
└─────────────────────────────────────────────────────────────┘
                              │
                              ▼
┌─────────────────────────────────────────────────────────────┐
│  PLACING THE SUPPORT STRUCTURE CONTAINING THE HEAT SINKS ONTO│
│   A SUBSTRATE CONTAINING NON-COPLANAR COMPONENTS SUCH THAT   │
│     RESPECTIVE HEAT SINKS ARE ALIGNED WITH RESPECTIVE NON-   │
│                     COPLANAR COMPONENTS                      │
│                             502                              │
└─────────────────────────────────────────────────────────────┘
                              │
                              ▼
┌─────────────────────────────────────────────────────────────┐
│ SECURING THE SUPPORT STRUCTURE TO THE SUBSTRATE ALLOWING THE │
│  HEAT SINKS TO ACCOMMODATE INDIVIDUAL HEIGHT TOLERANCES OF THE│
│      NON-COPLANAR COMPONENTS WHILE MAINTAINING RESPECTIVE    │
│    THERMAL BONDS BETWEEN THE NON-COPLANAR COMPONENTS AND THE │
│                          HEAT SINKS                          │
│                             503                              │
└─────────────────────────────────────────────────────────────┘
```

METHOD AND APPARATUS FOR ATTACHING MULTIPLE HEAT SINKS TO MULTIPLE NON-COPLANAR COMPONENTS

BACKGROUND

The present invention relates generally to heat sinks for electronic components and more particularly to a heat sink assembly of the kind that utilizes a spring that presses on one side of a multi-heat sink module to urge individual heat sinks to make good thermal contact with corresponding electronic components, such as integrated circuit chips.

Modern electronic appliances such as computers have many hundreds of integrated circuits and other electronic components, most of which are mounted on printed circuit boards. Many of these components generate heat during normal operation. Components that are relatively big or that have a relatively small number of functions in relation to their size, as for example individual transistors or small-scale integrated circuits, usually dissipate all their heat without a heat sink. The large physical sizes of such components, especially as compared with their active portions, limits their density on a circuit board sufficiently that there is enough room for any heat sinks that may be needed. Accordingly, any component that needs assistance in dissipating heat, regardless of size can have a heat sink of its own.

The term "heat sink" as used herein generally refers to a passive device, for example an extruded aluminum plate with a plurality of fins, which is thermally coupled to an electronic component to absorb heat from the component. The heat sink dissipates this heat into the air by convection.

One widely used method of increasing the speed of an electronic circuit is to reduce the lengths of the connecting wires. In part, this is accomplished by abandoning the older practice of enclosing each integrated circuit chip in a separate package in favor of mounting many chips next to each other on a single substrate. Such an assembly of chips and substrate is commonly referred to as a multi-chip module ("MCM"). However, since the chips are typically not all identical, the upper surface of this chips are not necessarily coplanar. In addition, the space required by the mounting hardware for an individual heat sink usually requires through holes in the printed circuit board. This negatively impacts routed traces in the area around the component being cooled by a heat sink. Another known heat sink system uses multiple springs to maintain the appropriate compressive force to maintain the required thermal bond between the heat sink and an upper surface of a chip or other component on the substrate.

It is also well known to attach a chip or other component to a heat sink with thermal paste or some other thermal interface material. However, the chips often are not all the same height above the substrate, for example because the chips themselves are of different thicknesses or because of variations in solder bump height or in flatness of the substrate. To compensate for these variations in height, a relatively thick layer of paste or other material must be used. The thermal conductivity of a given thermal interface material is not as good as that of solder, and the result is inadequate heat transfer when high-power chips are involved, for example.

There have been many attempts to solve the problem of dissipating heat developed by high-power integrated circuit chips in an MCM. Some of these solutions are mechanically complex, or are expensive, or make it difficult or impossible to rework or service the MCM. For these and other reasons, none of the prior approaches has adequately solved the problem. From the foregoing it will be apparent that there is still a need for a way to adequately dissipate heat from all the integrated circuit chips (or other components) in an MCM, for example. There is especially a need in the prior art for providing heat sinks for thermal components wherein there is a co-plurality tolerance between multiple packages (such as integrated circuit chips, heat producing components, etc.) on a printed circuit board assembly and wherein there may be limited mounting space on densely populated printed circuit boards.

SUMMARY

The invention in one embodiment encompasses an apparatus. A plurality of heat sinks in one example is coupled to a support structure. The support structure has a plurality of independent spring force elements that respectively contact the plurality of heat sinks such that each heat sink of the plurality of heat sinks is moveable within the support structure relative to the other heat sinks of the plurality of heat sinks. The support structure is coupled to a substrate having a plurality of components, each of the components having an upper surface, at least two of the upper surfaces being non-coplanar. The non-coplanar upper surfaces of the components are respectively coupled to the plurality of heat sinks by respective thermal interfaces.

Another embodiment of the invention encompasses an apparatus. The apparatus in one example may have a plurality of heat sinks coupled to a support structure. The support structure has a plurality of independent spring arms that respectively contact the plurality of heat sinks such that each heat sink of the plurality of heat sinks is moveable within the support structure relative to the other heat sinks of the plurality of heat sinks. The support structure has retention arms that are respectively coupled to the plurality of heat sinks, respective retention arms retaining each of the heat sinks within the support structure. A substrate is coupled to the support structure, the substrate having a plurality of components, each of the components having an upper surface, at least two of the upper surfaces being non-coplanar. Thermal interfaces are respectively coupled between the non-coplanar upper surfaces of the components and lower surfaces of the heat sinks. The heat sinks accommodate individual height tolerances of the components while maintaining thermal bonds with the heat sinks via independent compressive forces of the independent spring force elements.

Yet another embodiment of the invention encompasses a method. The method in one example may have the steps of: placing a plurality of heat sinks into a support structure, each of the heat sinks being independently moveable within the support structure; placing the support structure containing the heat sinks onto a substrate containing non-coplanar components such that respective heat sinks are aligned with respective non-coplanar components; and securing the support structure to the substrate allowing the heat sinks to accommodate individual height tolerances of the non-coplanar components while maintaining respective thermal bonds between the non-coplanar components and the heat sinks.

DESCRIPTION OF THE DRAWINGS

Features of exemplary implementations of the invention will become apparent from the description, the claims, and the accompanying drawings in which:

DETAILED DESCRIPTION

Figure 1:
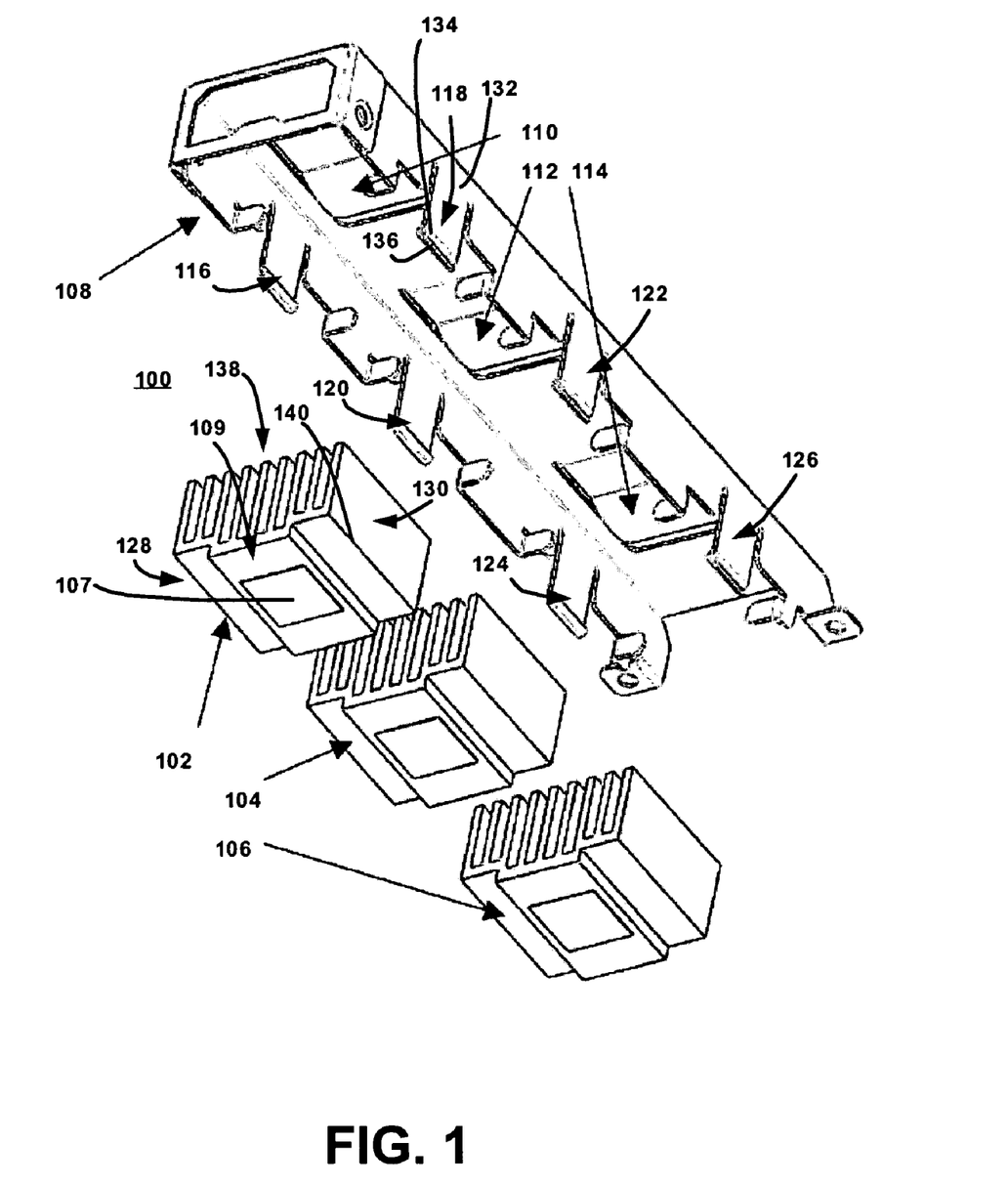
FIG. 1 is a representation of an exemplary implementation of an apparatus that comprises a support structure for containing multiple heat sinks.

An apparatus 100, in one example, may have a plurality of heat sinks 102, 104, 106 coupled to a support structure 108. Each of the heat sinks 102, 104, 106, such as heat sink 102, may have thermal interface material 107 applied to a bottom surface 109 of the heat sink 102. The thermal interface material 107 may be a thermal paste, for example. The support structure 108 may have a plurality of independent spring arms 110, 112, 114 that respectively contact the plurality of heat sinks 102, 104, 106 such that each heat sink of the plurality of heat sinks 102, 104, 106 is moveable within the support structure 108 relative to the other heat sinks of the plurality of heat sinks 102, 104, 106. The support structure 108 may also have retention arms 116, 118, 120, 122, 124, 126 that are respectively coupled to the plurality of heat sinks 102, 104, 106. Respective retention arms, such as 116, 118 retaining each of the heat sinks, such as 102 within the support structure 108.

The heat sinks 102, 104, 106 may be coupled to the support structure 108 in a predetermined configuration. As depicted in FIG. 1 the predetermined configuration is a row of heat sinks 102, 104, 106. The predetermined configuration may be any of a variety of configurations, such as a longer row of more than three heat sinks, a double row of heat sinks, heat sinks arranged in a square configuration, etc. Also, depending on the application, less than the maximum number of heat sinks may be retained in the support structure. For example, in the FIG. 1 example, only one or two heat sinks may be retained in the support structure leaving some locations for heat sinks empty.

Figure 2:
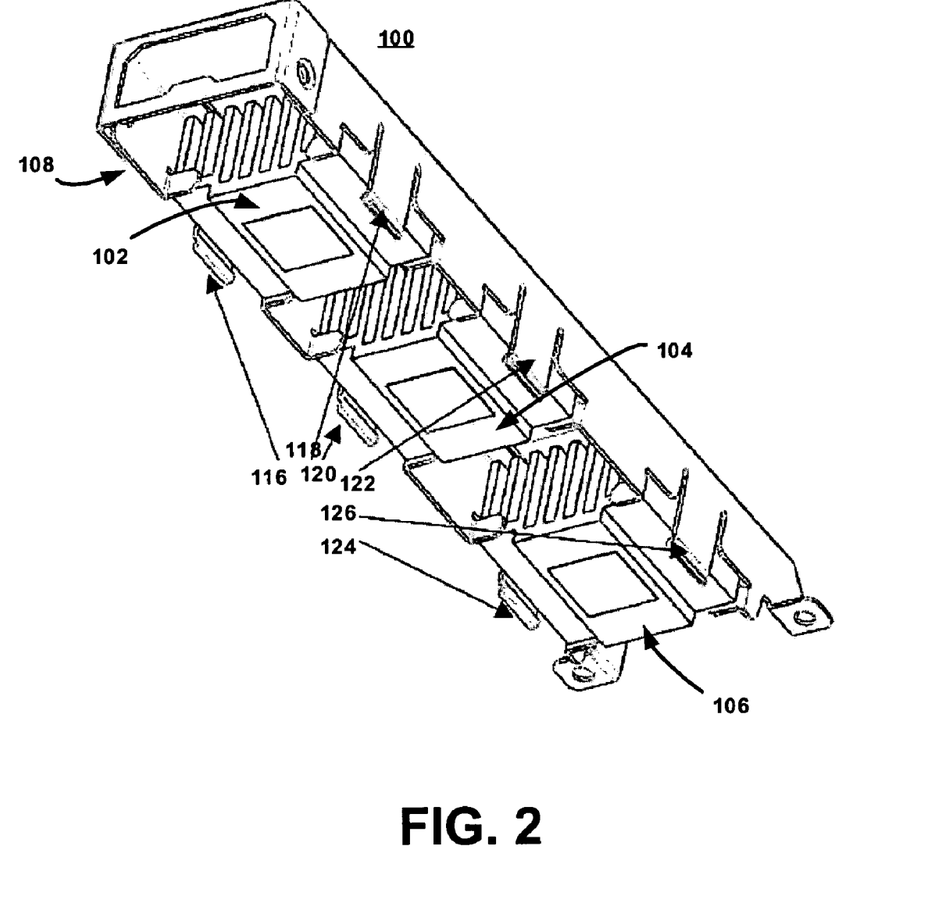
FIG. 2 is a representation of the FIG. 1 exemplary implementation of the support structure containing multiple heat sinks.

As depicted in FIG. 2 in order to retain a respective heat sink, such as heat sink 102 in the support structure 108, the support structure 108 may have a respective pair of opposed retention arms, such as 116, 118 of the plurality of retention arms 116, 118, 120, 122, 124, 126 that engage opposite sides, such as 128 and 130 of the respective heat sink 102. Furthermore, each of the retention arms, such as 118, may have a first end 132 attached to the support structure 108 and a second end 134 having a lip 136 that is engageable with a bottom edge 140 of a respective heat sink 102. Other configurations and structures may be used to retain the heat sinks 102, 104, 106 in the support structure 108. The retention arms retain the heat sinks in the support structure; yet allow the heat sinks to be moveable in the support structure. In the FIGS. 1 and 2 examples, the heat sinks 102, 104, 106 may move within the support structure 108 substantially parallel to the retention arms 116, 118.

In the FIGS. 1 and 2 examples, a respective spring arm, such as spring arm 110 of the plurality of spring arms 110, 112, 114, engages a top surface 142 of the respective heat sink 102. The spring arm 110 exerts a spring force on the heat sink 102 allowing the heat sink 102 to move with in the support structure 108. Although in the example the movement is primarily in a direction substantially parallel to the retention arms, other limited movement directions, such as lateral and tipping (rotational) are also possible.

Figure 3:
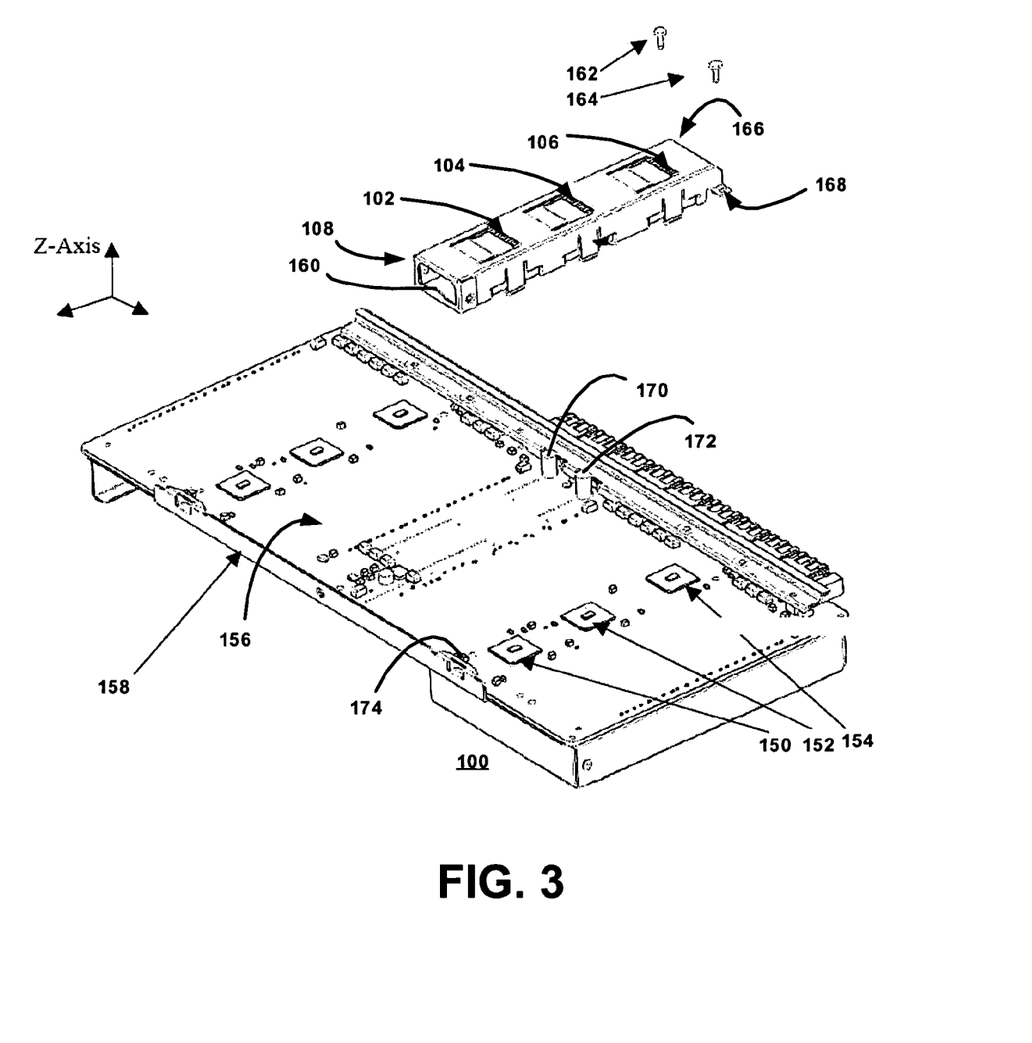
FIG. 3 is a representation of an assembly, for use with the FIG. 1 exemplary implementation, of multiple components that require heat sinks for cooling, and a substrate to which are coupled the components.

FIG. 3 depicts an assembly of components, such as chips 150, 152, 154, that require heat sinks 102, 104, 106 for cooling, and a substrate, such as a printed circuit board 156, to which are coupled the components 150, 152, 154. However, since the chips 150, 152, 154 are typically not all identical, the upper surfaces of these chips 150, 152, 154 are not necessarily coplanar. Thus, the heat sinks 102, 104, 106 must be positioned at different heights with different planarity relative to one another with forces that direct the heat sinks 102, 104, 106 toward the chips 150, 152, 154 in order to effect independent compressive forces between the heat sinks 102, 104, 106 and the chips 150, 152, 154, which provides the necessary thermal bonding. These forces may be substantially equal.

In the FIG. 3 example, the forces may be spring forces effected by spring arms 110, 112, 114 on the support structure 108. The heat sinks 102, 104, 106 accommodate individual height tolerances of the components 150, 152, 154 while maintaining thermal bonds with the heat sinks 102, 104, 106 via independent compressive forces of independent spring force elements, such as spring arms 110, 112, 114. As a result the thermal interface materials 107 between the heat sinks 102, 104, 106 and the chips 150, 152, 154 form thermal bonds that may be substantially equal.

In one example, the printed circuit board may be attached to or contained in a frame, such as the tray assembly 158. The support structure 108 may be coupled to the printed circuit board 156 via a variety of means, such as securing screws 164, 166, which extend through openings 166, 168 in the support structure 108 and into threaded holes 170, 172 in the tray assembly 158. Tab 160 on the support structure 108 interfaces with slot 174 in the tray assembly 158. The frame and securing mechanisms may have a variety of different configurations.

The support structure 108 with the heat sinks 102, 104, 106 works equally as well when two or more of the chips 150, 152, 154 are co-planar, and even when all of the chips 150, 152, 154 are co-planar. In general the components or chips are referred to as being non-coplanar. More precisely, however, it is the upper surfaces of the chips, which are non-coplanar.

Figure 4:
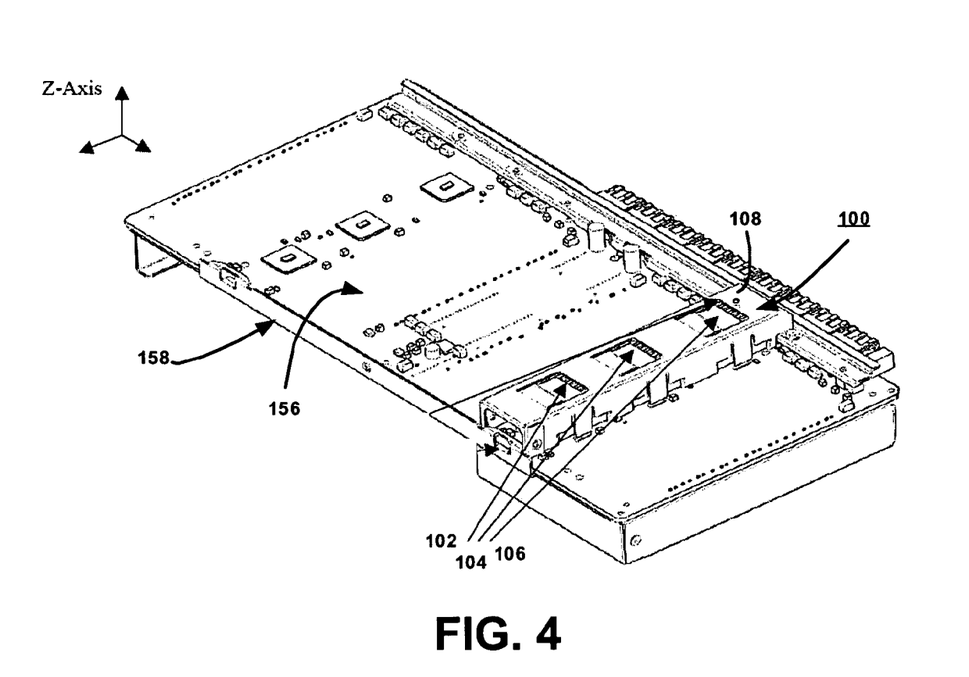
FIG. 4 is another representation of an assembly, for use with the FIG. 1 exemplary implementation, of multiple components that require heat sinks for cooling, and a substrate to which are coupled the components.

Referring to FIG. 4, the support structure 108 is shown attached to the tray assembly 158. Although the support structure may be coupled to a frame that in turn is coupled to the substrate, the support structure may alternatively be coupled directly to the substrate.

Figure 5:
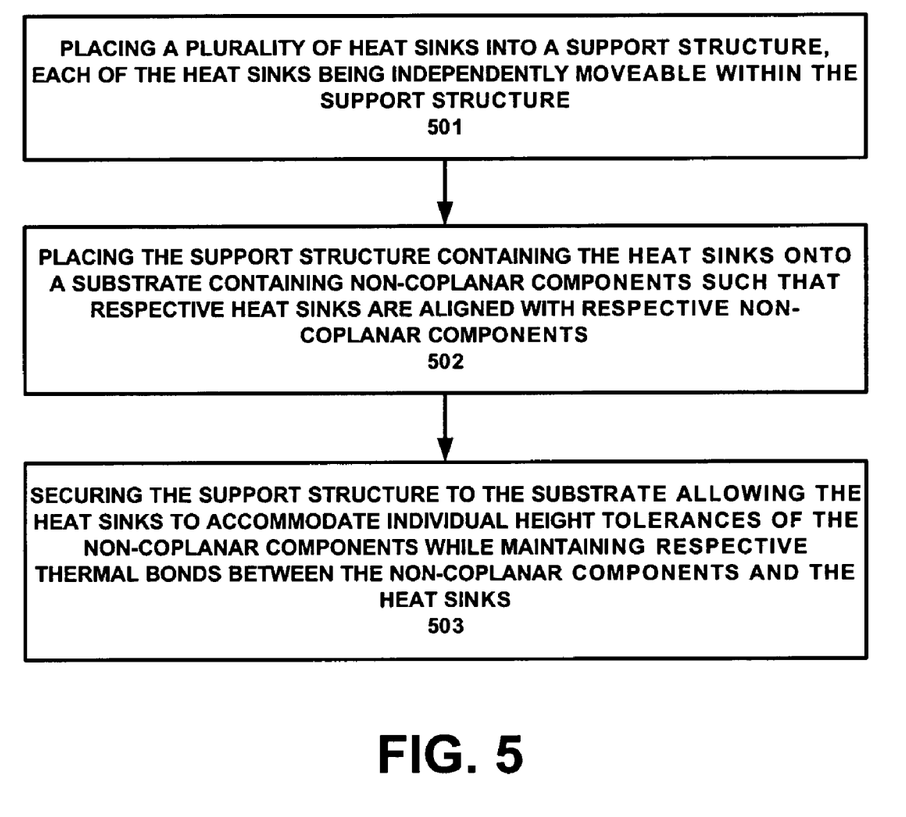
FIG. 5 is a representation of the general steps of a method of attaching multiple heat sinks to multiple non-coplanar components.

FIG. 5 depicts a general block diagram of one example of the method. The method may have the steps of: placing a plurality of heat sinks into a support structure, each of the heat sinks being independently moveable within the support structure (step 501); placing the support structure containing the heat sinks onto a substrate containing non-coplanar components such that respective heat sinks are aligned with respective non-coplanar components (step 502); and securing the support structure to the substrate allowing the heat sinks to accommodate individual height tolerances of the non-coplanar components while maintaining respective thermal bonds between the non-coplanar components and the heat sinks via the respective independent spring forces. (step 503). In an embodiment of the present apparatus spring forces may be applied by individual springs on the heat sinks to maintain the appropriate thermal bond.

Figure 6:
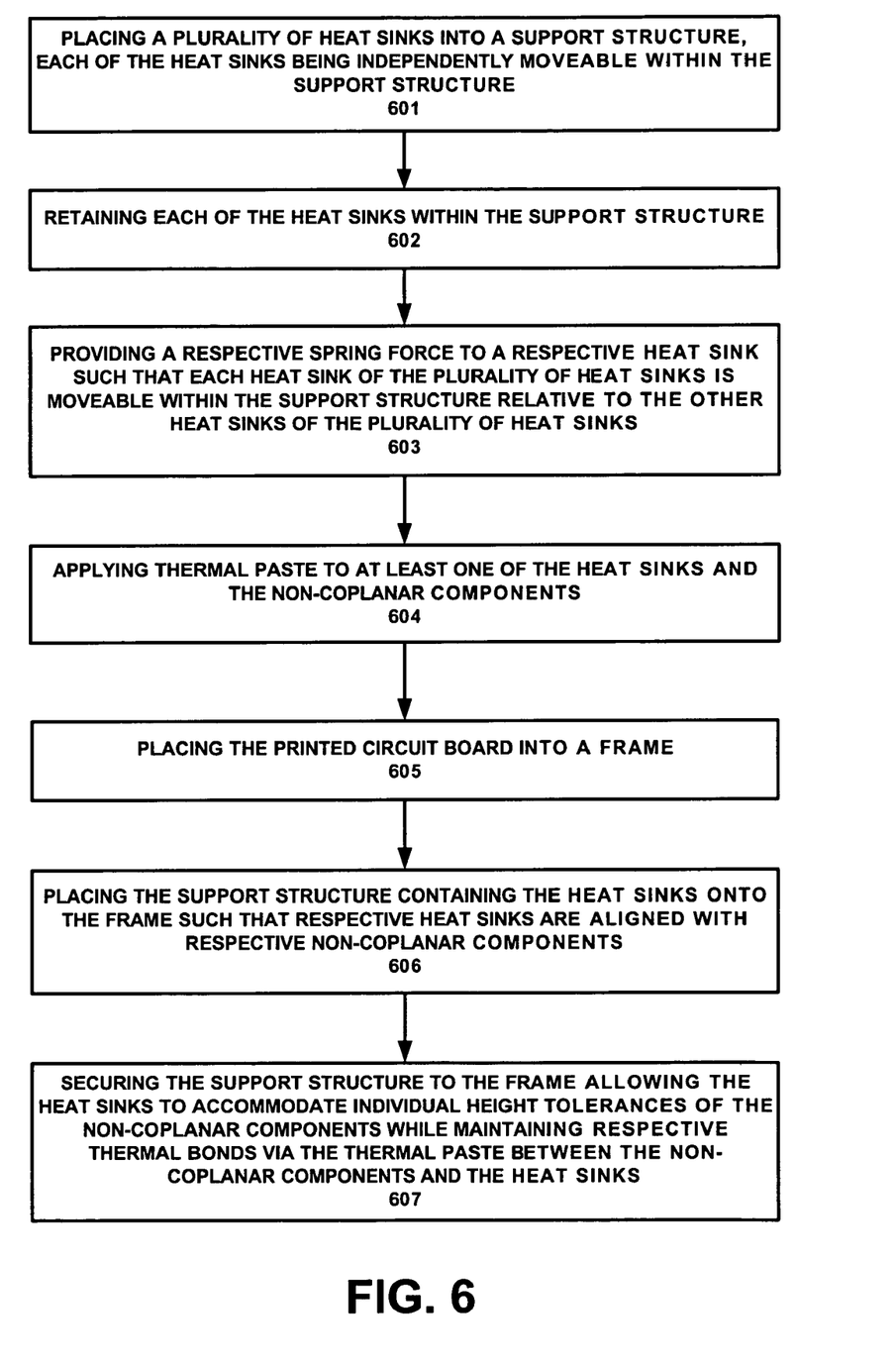
FIG. 6 is a representation of more specific steps of a method of attaching multiple heat sinks to multiple non-coplanar components.

FIG. 6 depicts a more specific block diagram of one example of the method for use with a printed circuit board having non-coplanar components. The method may have the steps of: placing a plurality of heat sinks into a support structure, each of the heat sinks being independently moveable within the support structure (step 601); retaining each of the heat sinks within the support structure (step 602); providing a respective spring force to a respective heat sink such that each heat sink of the plurality of heat sinks is moveable within the support structure relative to the other heat sinks of the plurality of heat sinks (step 603); applying thermal paste to at least one of the heat sinks and the non-coplanar components (step 604); placing the printed circuit board into a frame (step 605); placing the support structure containing the heat sinks onto the frame such that respective heat sinks are aligned with respective non-coplanar components (step 606); and securing the support structure to the frame allowing the heat sinks to accommodate individual height tolerances of the non-coplanar components while maintaining respective thermal bonds via the thermal paste between the non-coplanar components and the heat sinks (step 607).

The apparatus 100 in one example comprises a plurality of components such as hardware components. A number of such components can be combined or divided in one example of the apparatus 100. The apparatus 100 in one example comprises any (e.g., horizontal, oblique, or vertical) orientation, with the description and figures herein illustrating one exemplary orientation of the apparatus 100, for explanatory purposes.

Thus, the drawbacks of the prior art devices are overcome by embodiments of the present method and apparatus. This is accomplished in general by: three heat sinks that are capable of movement in the z-axis being placed into a single structure; the structure containing the heat sinks being placed onto the structure containing the non-coplanar components meant to receive the heat sinks; and the two structures being secured together allowing the heat sinks to accommodate the individual tolerance of each component while maintaining an adequate thermal bond thru the compressive force of the structures integral spring arms. This fulfills the need to support multiple heat sink masses while simultaneously allowing a large degree of z-axis tolerance inherent in printed circuit board fabrication while applying the appropriate compressive force to maintain a stable thermal bond between each heat sink and its respective component.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising:
a plurality of heat sinks coupled to a support structure, wherein the support structure has a plurality of independent spring force elements that respectively contact the plurality of heat sinks such that each heat sink of the plurality of heat sinks is moveable within the support structure relative to the other heat sinks of the plurality of heat sinks, and wherein the support structure has retention structures that are respectively coupled to the plurality of heat sinks and that retain each of the heat sinks within the support structure, and wherein the retention structures are retention arms that are respectively coupled to the plurality of heat sinks, respective retention arms retaining each of the heat sinks within the support structure.

2. The apparatus of claim 1, wherein the plurality of heat sinks is coupled to the support structure in a predetermined configuration.

3. The apparatus of claim 2, wherein the predetermined configuration is a row of heat sinks.

4. The apparatus of claim 1, wherein each of the retention arms has a first end attached to the support structure and a second end having a lip that is engageable with a bottom edge of a respective heat sink.

5. The apparatus of claim 1, wherein the spring force elements are spring arms.

6. The apparatus of claim 5, wherein a respective spring arm engages a top surface of a respective heat sink of the plurality of heat sinks.

7. The apparatus of claim 1, wherein the support structure is coupled to a substrate having a plurality of components, each of the components having an upper surface, at least two of the upper surfaces being non-coplanar, and wherein the non-coplanar upper surfaces of the components are respectively coupled to the plurality of heat sinks by respective thermal interfaces.

8. The apparatus of claim 7, wherein the thermal interfaces are thermal pastes.

9. An apparatus, comprising:
a plurality of heat sinks coupled to a support structure;
the support structure having a plurality of independent spring arms that respectively contact the plurality of heat sinks such that each heat sink of the plurality of heat sinks is moveable within the support structure relative to the other heat sinks of the plurality of heat sinks;
the support structure having retention arms that are respectively coupled to the plurality of heat sinks, respective retention arms retaining each of the heat sinks within the support structure;
a substrate coupled to the support structure, the substrate having a plurality of components, each of the components having an upper surface, at least two of the upper surfaces being non-coplanar;
thermal interfaces respectively coupled between the non-coplanar upper surfaces of the components and lower surfaces of the heat sinks;
wherein the heat sinks accommodate individual height tolerances of the components while maintaining thermal bonds with the heat sinks via independent compressive forces of the independent spring force elements.

10. The apparatus of claim 9, wherein the plurality of heat sinks is coupled to the support structure in a predetermined configuration.

11. The apparatus of claim 10, wherein the predetermined configuration is a row of heat sinks, wherein the substrate is a printed circuit board, wherein the printed circuit board is coupled to a frame structure, and wherein the support structure is coupled to the frame structure.

12. The apparatus of claim 9, wherein the support structure has a respective pair of opposed retention arms of the plurality of retention arms that engage opposite sides of a respective heat sink of the plurality of heat sinks.

13. The apparatus of claim 9, wherein each of the retention arms has a first end attached to the support structure and a second end having a lip that is engageable with a bottom edge of a respective heat sink.

14. The apparatus of claim 9, wherein a respective spring arm of the plurality of spring arms engages a top surface of a respective heat sink of the plurality of heat sinks.

15. The apparatus of claim 9, wherein the thermal interfaces are thermal pastes.

16. The apparatus of claim 9, wherein the independent compressive forces are substantially equal.

17. The apparatus of claim 9, wherein the thermal bonds are substantially equal.

18. An apparatus, comprising:
a plurality of heat sinks coupled to a support structure, wherein the support structure has a plurality of independent spring force elements that respectively contact the plurality of heat sinks such that each heat sink of the plurality of heat sinks is moveable within the support structure relative to the other heat sinks of the plurality of heat sinks, and wherein the support structure has retention structures that are respectively coupled to the plurality of heat sinks and that retain each of the heat sinks within the support structure, and wherein the retention structures comprise a plurality of retention arms, and wherein a respective pair of opposed retention arms of the plurality of retention arms engage opposite sides of a respective heat sink of the plurality of heat sinks.

* * * * *

UNITED STATES PATENT AND TRADEMARK OFFICE
CERTIFICATE OF CORRECTION

PATENT NO. : 7,269,018 B1
APPLICATION NO. : 10/934926
DATED : September 11, 2007
INVENTOR(S) : Bryan Bolich et al.

It is certified that error appears in the above-identified patent and that said Letters Patent is hereby corrected as shown below:

In column 2, line 7, delete "co-plurality" and insert -- co-planarity --, therefor.

Signed and Sealed this

Fifteenth Day of September, 2009

David J. Kappos
*Director of the United States Patent and Trademark Office*